(12) United States Patent
Fududa et al.

(10) Patent No.: US 7,947,192 B2
(45) Date of Patent: May 24, 2011

(54) GALLATE SINGLE CRYSTAL, PROCESS FOR PRODUCING THE SAME, PIEZOELECTRIC DEVICE FOR HIGH-TEMPERATURE USE AND PIEZOELECTRIC SENSOR FOR HIGH-TEMPERATURE USE

(75) Inventors: Tsuguo Fududa, Sendai (JP); Akira Yoshikawa, Sendai (JP); Hiroki Sato, Sendai (JP)

(73) Assignee: Fukuda Crystal Laboratory, Miyagi (JP)

( * ) Notice: Subject to any disclaimer, the term of this patent is extended or adjusted under 35 U.S.C. 154(b) by 765 days.

(21) Appl. No.: 11/910,306

(22) PCT Filed: Mar. 30, 2006

(86) PCT No.: PCT/JP2006/306744
§ 371 (c)(1),
(2), (4) Date: Nov. 16, 2007

(87) PCT Pub. No.: WO2006/106875
PCT Pub. Date: Oct. 12, 2006

(65) Prior Publication Data
US 2008/0081013 A1    Apr. 3, 2008

(51) Int. Cl.
*H01L 41/18* (2006.01)
*C30B 29/34* (2006.01)

(52) U.S. Cl. .................. 252/62.9 R; 117/942; 310/311; 310/329; 310/319

(58) Field of Classification Search ............. 252/62.9 R; 117/942; 310/311, 329, 319
See application file for complete search history.

(56) References Cited

U.S. PATENT DOCUMENTS 7,622,851 B2 * 11/2009 Zhang et al. ................ 310/358
2003/0214983 A1 * 11/2003 Wang et al. .................... 372/10

FOREIGN PATENT DOCUMENTS

| JP | 3-199198 | 8/1991 |
| JP | 7-206577 | 8/1995 |
| JP | 10-54773 | 2/1998 |
| JP | 10-273398 | * 10/1998 |
| JP | 2002-220298 | * 8/2002 |
| RU | 1506951 | * 12/1992 |

OTHER PUBLICATIONS

Kumatoriya et al, "Crystal growth and electromechanical properties of Al substituted langasite (La3Ga5-xAlxSiO14)", Journ. Crystal Growth 229, 2001, pp. 289-293.*

Takeda et al. "Effect of aluminum substitution in La3Ga5SiO14 crystals on their structure and piezoelectricity", App. Phys. Lett. vol. 79, No. 25, Dec. 2001, pp. 4201-4203.*

(Continued)

*Primary Examiner* — C. Melissa Koslow
(74) *Attorney, Agent, or Firm* — Young & Thompson

(57) ABSTRACT

A material for high-temperature region piezoelectric device that can be used at a high temperature zone exceeding 400 DEG C, having a resistivity whose temperature dependence is slight. The material is characterized by having a composition selected from the group consisting of $RE_3Ga_{5-x}Al_xSiO_{14}$ (wherein RE represents a rare earth, and 0<X<5), $RE_3Ta_{0.5}Ga_{5.5-x}Al_xO_{14}$ (wherein RE represents a rare earth, and 0<X<5.5) and $RE_3Nb_{0.5}Ga_{5.5-x}Al_xO_{14}$ (wherein RE represents a rare earth, and 0<x<5.5) and by exhibiting a 100 to 600° C. resistivity change of $\leq 10^4$. The process for producing the same is characterized by growing a single crystal from a solution in an atmosphere of inert gas containing an oxidative gas and thereafter cooling the single crystal in an inert gas whose oxidative gas molar fraction (z) is lower than in the above growing step.

5 Claims, 6 Drawing Sheets

OTHER PUBLICATIONS

Takeda et al. "Structure and Piezoelectric Propeties of Al-substituted Langasite (La3Ga5-xAlxSiO14) Crystals", Key Engineering Materials, vol. 216, Jan. 2002, pp. 43-46.*

Takeda Hiroaki et al: "Effect of aluminum substitution in La3Ga5SiO14 crystals on their structure and piezoelectricity", Applied Physics Letters, AIP, American Institute of Physics, Melville, NY, US LNKD-DOI:10.1063/1.1426274, vol. 79, No. 25, Dec. 17, 2001, pp. 4201-4203, XP012029697, ISSN: 0003-6951.

Takeda H et al: "Structure and piezoelectric properties of Al-substituted langasite (La3Ga5-xAlxSio14) crystals", Key Engineering Materials, Trans Tech Publications Ltd., Stafa-Zurich, CH, vol. 216, Jan. 1, 2002, pp. 43-46, XP009131877, ISSN: 1013-9826.

* cited by examiner

GALLATE SINGLE CRYSTAL, PROCESS FOR PRODUCING THE SAME, PIEZOELECTRIC DEVICE FOR HIGH-TEMPERATURE USE AND PIEZOELECTRIC SENSOR FOR HIGH-TEMPERATURE USE

TECHNICAL FIELD

The present invention relates to an Al added rare earth gallate single crystal, a piezoelectric device for high temperature use using the single crystal and a piezoelectric sensor for high temperature use using the piezoelectric device, and a process for producing the single crystal.

BACKGROUND ART

Conventionally, piezoelectric sensors have been often used for measuring a pressure or a force. The piezoelectric sensor has excellent properties, e.g., no displacement of the sensor itself, a high speed of response and a small size. However, the piezoelectric sensor can not be used when the temperature of a sensor device exceeds Curie temperature. Thus, for example, when quartz is used as the sensor device, it can not be used in a temperature zone exceeding 400° C., and pressure (combustion pressure) variation can not be directly measured in the temperature zone exceeding 1000° C. when a fuel-air mixture in a combustion chamber is exploded in an internal combustion.

Meanwhile, for the purpose of being used at high temperature, it is proposed to use rare earth gallate ($La_3Ga_5SiO_{14}$) single crystal having no Curie point (e.g., see Patent Document 1). A melting point of the rare earth gallate single crystal is 1500° C., and thus, it is possible to use it as the piezoelectric sensor even at the temperature zone exceeding 1000° C. However, in the rare earth gallate single crystal, its resistivity largely depends on the temperature, its resistivity becomes small at the high temperature zone and sufficient voltage can not be kept at the high temperature zone. Thus, it is problematic in that the combustion pressure variation can not be precisely measured.

Patent Document 1: JP Hei-10-54773-A

DISCLOSURE OF INVENTION

Problem to be Solved by the Invention

It is an object of the present invention to provide a gallate single crystal which can be used at a high temperature zone at 100° C. or above, particularly exceeding 400° C. and has a resistivity whose temperature dependence is low, and a process for producing the same, and a piezoelectric device and a piezoelectric sensor for high temperature use.

Means for Solving Problem

The invention according to a first embodiment is a gallate single crystal characterized by having a composition selected from the group consisting of $RE_3Ga_{5-x}Al_xSiO_{14}$ (wherein RE represents a rare earth, and $0<x<5$), $RE_3Ta_{0.5}Ga_{5.5-x}Al_xO_{14}$ (wherein RE represents a rare earth, and $0<x<5.5$) and $RE_3Nb_{0.5}Ga_{5.5-x}Al_xO_{14}$ (wherein RE represents a rare earth, and $0<x<5.5$), and characterized in that a resistivity change is $10^4$ or less at a temperature zone of 100° C. to 600° C.

The invention according to a second embodiment is the single crystal according to the first embodiment characterized by being $0<x<1.5$ in $RE_3Ga_{5-x}Al_xSiO_{14}$, $0<x<1.65$ in $RE_3Ta_{0.5}Ga_{5.5-x}Al_xO_{14}$, and $0<x<1.65$ in $RE_3Nb_{0.5}Ga_{5.5-x}Al_xO_{14}$.

The invention according to a third embodiment is a gallate single crystal characterized by having a composition selected from the group consisting of $RE_{3-x}AE_xGa_{5-x-y}Al_ySiO_{14}$ (wherein RE represents a rare earth and AE represents an alkali earth metal. $0<x\leq3$, $0<y<1.5$), $RE_{3-x}AE_xTa_{0.5+x/2}Ga_{5.5-x/2-y}Al_yO_{14}$ (wherein RE represents a rare earth and AE represents an alkali earth metal. $0\leq x\leq3$, $0<y<1.65$), and $RE_{3-x}AE_xNb_{0.5+x/2}Ga_{5.5-x/2-y}Al_yO_{14}$ (wherein RE represents a rare earth and AE represents an alkali earth metal. $0<x\leq3$, $0<y<1.65$), and characterized in that a resistivity change is $10^4$ or less at a temperature zone of 100° C. to 600° C.

That is, a part or all of RE may be substituted with AE in the invention according to the first embodiment.

The invention according to a fourth embodiment is a process for producing a gallate oxide single crystal characterized by growing a single crystal from a solution in an atmosphere of inert gas containing an oxidative gas and then cooling the single crystal with lowering a molar fraction (z) of the oxidative gas in the inert gas below a molar fraction of the oxidative gas in the growing step.

The inert gas includes, for example, Ar gas and nitrogen gas. As the oxidative gas, oxygen gas is preferable.

The invention according to a fifth embodiment is the process for producing the gallate oxide single crystal according to the fourth embodiment characterized by being $0\leq z\leq1\%$.

The invention according to a sixth embodiment is the process for producing the gallate oxide single crystal according to the fourth embodiment characterized by being $0\leq z\leq0.5\%$.

The invention according to a seventh embodiment is the process for producing the gallate oxide single crystal according to any one of the fourth to sixth embodiments characterized in that the oxidative gas is $O_2$.

The invention according to an eighth embodiment is a process for producing a gallate oxide single crystal characterized in that coloration due to defect is reduced and temperature dependence of a resistivity is reduced by thermally treating the gallate oxide single crystal produced by the process according to any one of the fourth to seventh embodiments in an atmosphere of an inert gas without containing an oxidative gas.

The invention according to a ninth embodiment is the process for producing the gallate oxide single crystal according to any one of the fourth to eighth embodiments characterized in that the gallate oxide is a rare earth gallate oxide.

The invention according to a tenth embodiment is the process for producing the gallate oxide single crystal according the ninth embodiment characterized in that the gallate oxide has a composition selected from the group consisting of $RE_3Ga_{5-x}Al_xSiO_{14}$ (wherein RE represents a rare earth, and $0<x<5$), $RE_3Ta_{0.5}Ga_{5.5-x}Al_xO_{14}$ (wherein RE represents a rare earth, and $0<x<5.5$) and $RE_3Nb_{0.5}Ga_{5.5-x}Al_xO_{14}$ (wherein RE represents a rare earth, and $0<x<5.5$).

The invention according to an eleventh embodiment is the process for producing the gallate oxide single crystal according the tenth embodiment characterized by being $0<x<1.5$ in $RE_3Ga_{5-x}Al_xSiO_{14}$, $0<x<1.65$ in $RE_3Ta_{0.5}Ga_{5.5-x}Al_xO_{14}$, and $0<x<1.65$ in $RE_3Nb_{0.5}Ga_{5.5-x}Al_xO_{14}$.

The invention according to a twelfth embodiment is the process for producing the gallate oxide single crystal according the ninth embodiment characterized in that the gallate oxide has a composition selected from the group consisting of $RE_{3-x}AE_xGa_{5-x-y}Al_ySiO_{14}$ (wherein RE represents a rare earth and AE represents an alkali earth metal. $0<x\leq3$, $0<y<1.5$), $RE_{3-x}AE_xTa_{0.5+x/2}Ga_{5.5-x/2-y}Al_yO_{14}$ (wherein RE represents a rare earth and AE represents an alkali earth metal. $0<x\leq3$, $0<y<1.65$) and $RE_{3-x}AE_xNb_{0.5+x/2}Ga_{5.5-x/2-y}Al_yO_{14}$ (wherein RE represents a rare earth and AE represents an alkali earth metal. $0<x\leq3$, $0<y<1.65$).

The invention according to a thirteenth embodiment is a single crystal characterized by being produced by the process according to any one of the fourth to twelfth embodiments.

The invention according to a fourteenth embodiment is a piezoelectric device characterized by being composed of the single crystal according to any one of the first, second, third, and thirteenth embodiments.

The invention according to a fifteenth embodiment is a piezoelectric sensor for high temperature use characterized by using the piezoelectric device according to the fourteenth embodiment.

The invention according to a sixteenth embodiment is the piezoelectric sensor for high temperature use according to the fifteenth embodiment characterized being used at a temperature zone of 100° C. to 600° C.

EFFECT OF THE INVENTION

According to the present invention, it becomes possible to provide the gallate single crystal which can be used at the high temperature zone particularly exceeding 400° C. and further has the resistivity whose temperature dependence is low, and the process for production thereof, as well as the piezoelectric device and the piezoelectric sensor for high temperature uses.

BEST MODES FOR CARRYING OUT THE INVENTION

Figure 1:
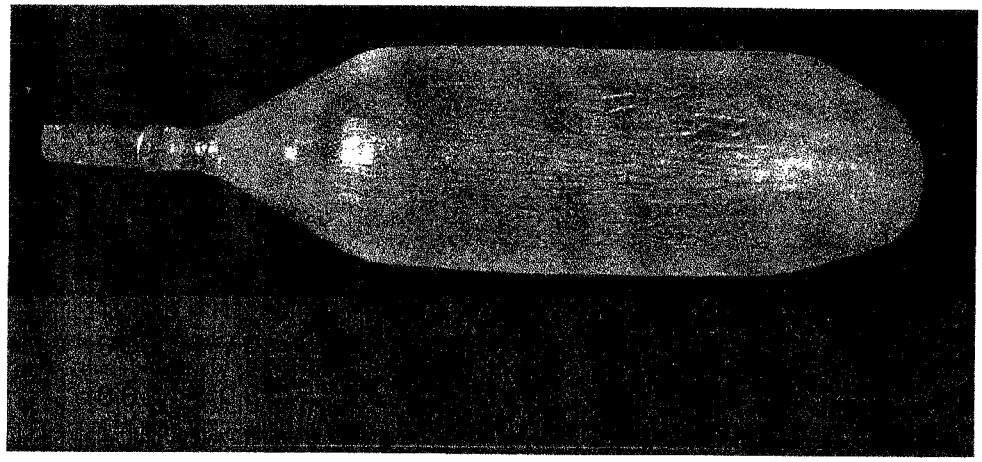
FIG. 1 is a photograph showing $La_3Ga_{4.8}Al_{0.2}SiO_{14}$ single crystal.
Figure 2:
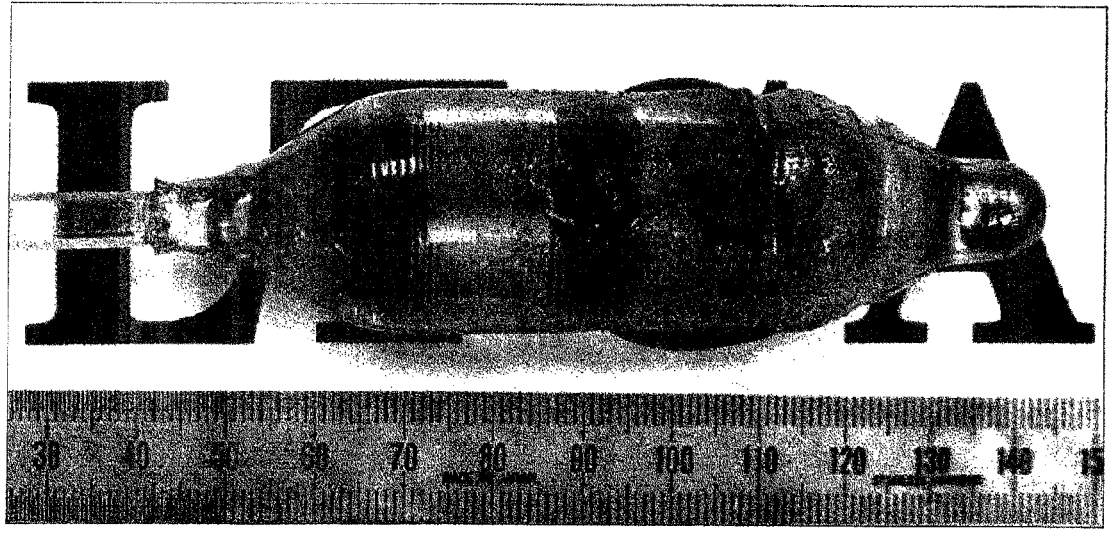
FIG. 2 is a photograph showing $La_3Ta_{0.5}Ga_{5.3}Al_{0.2}O_{14}$ single crystal.
Figure 3:
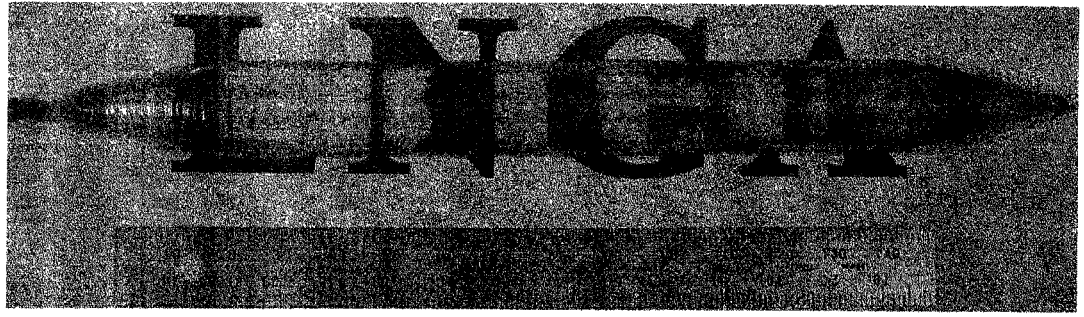
FIG. 3 is a photograph showing $La_3Nb_{0.5}Ga_{5.3}Al_{0.2}O_{14}$ single crystal.
Figure 4:
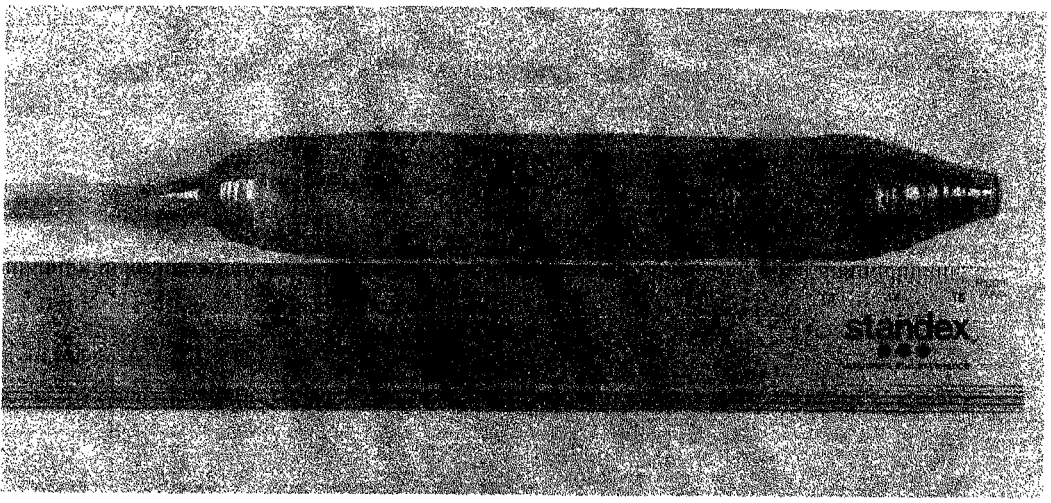
FIG. 4 is a photograph showing $La_3Ga_5SiO_{14}$ single crystal.
Figure 5:
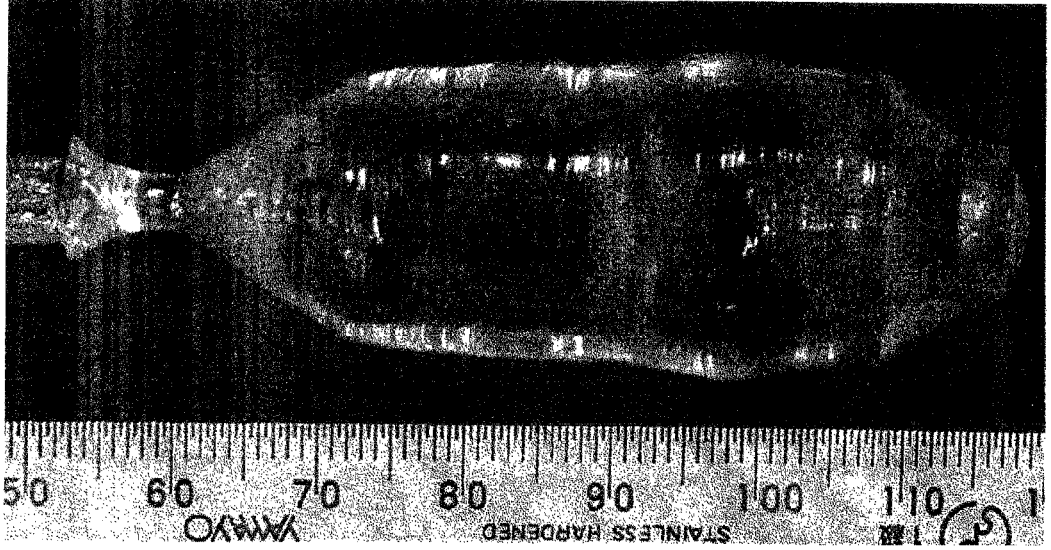
FIG. 5 is a photograph showing $La_3Ta_{0.5}Ga_{5.5}O_{14}$ single crystal.
Figure 6:
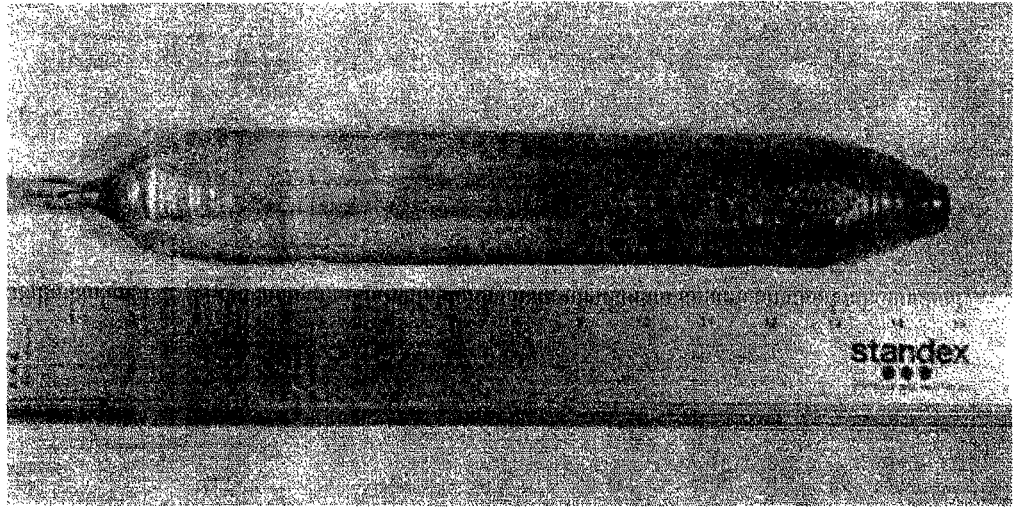
FIG. 6 is a photograph showing $La_3Nb_{0.5}Ga_{5.5}O_{14}$ single crystal.
Figure 7:
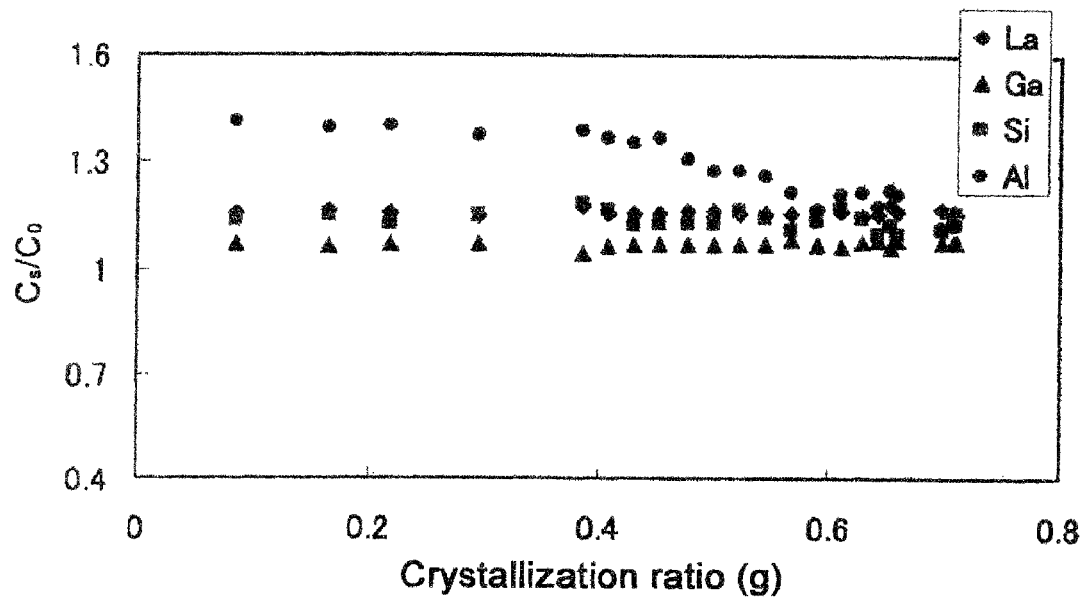
FIG. 7 is a graph showing an atomic distribution of $La_3Ga_{4.8}Al_{0.2}SiO_{14}$ single crystal.
Figure 8:
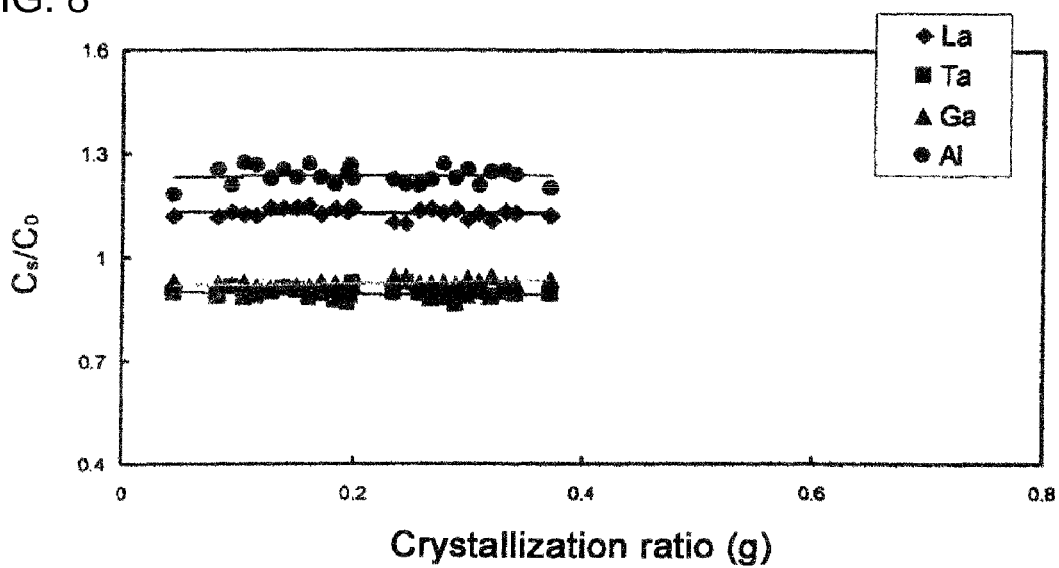
FIG. 8 is a graph showing an atomic distribution of $La_3Ta_{0.5}Ga_{5.3}Al_{0.2}O_{14}$ single crystal.
Figure 9:
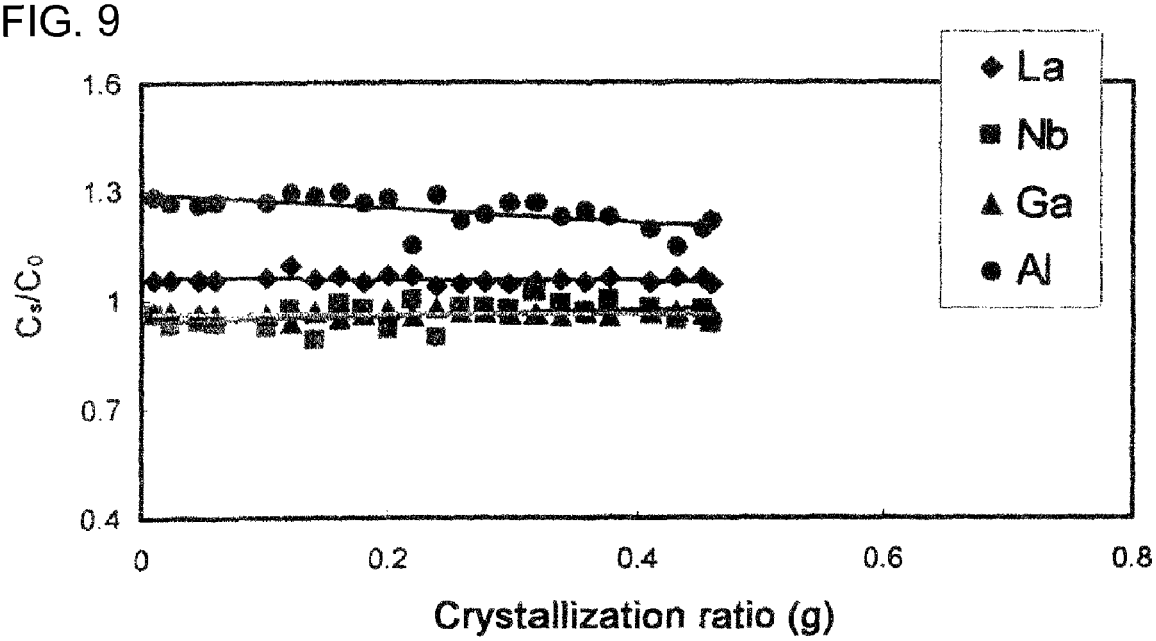
FIG. 9 is a graph showing an atomic distribution of $La_3Nb_{0.5}Ga_{5.3}Al_{0.2}O_{14}$ single crystal.
Figure 10:
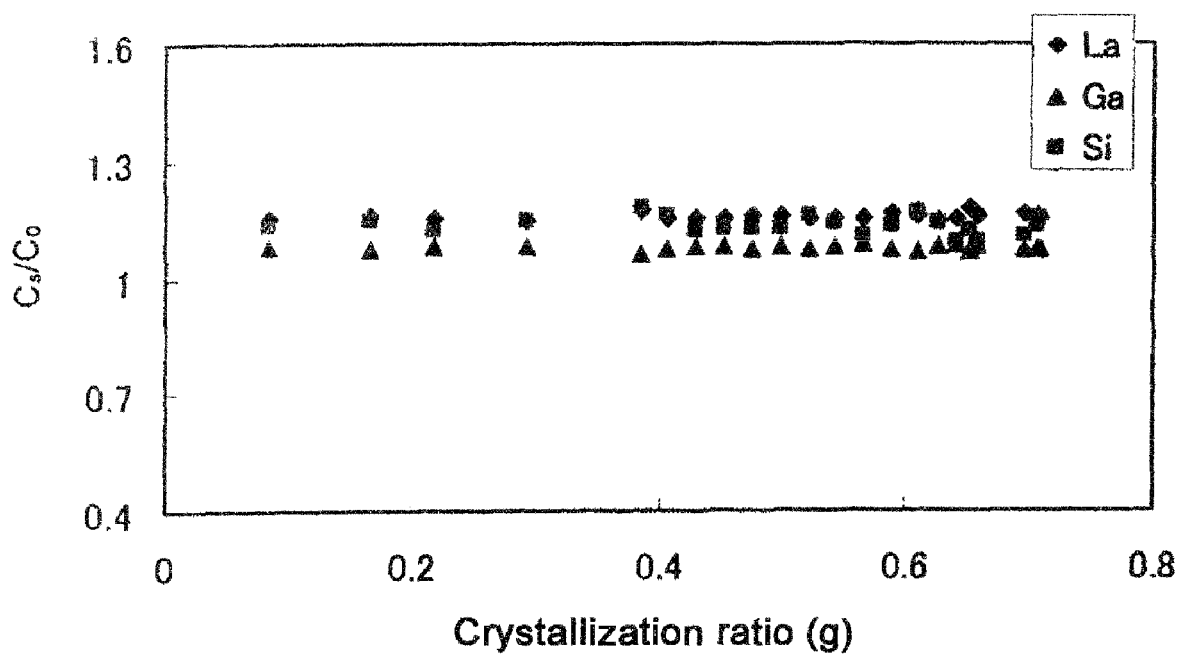
FIG. 10 is a graph showing an atomic distribution of $La_3Ga_5SiO_{14}$ single crystal.
Figure 11:
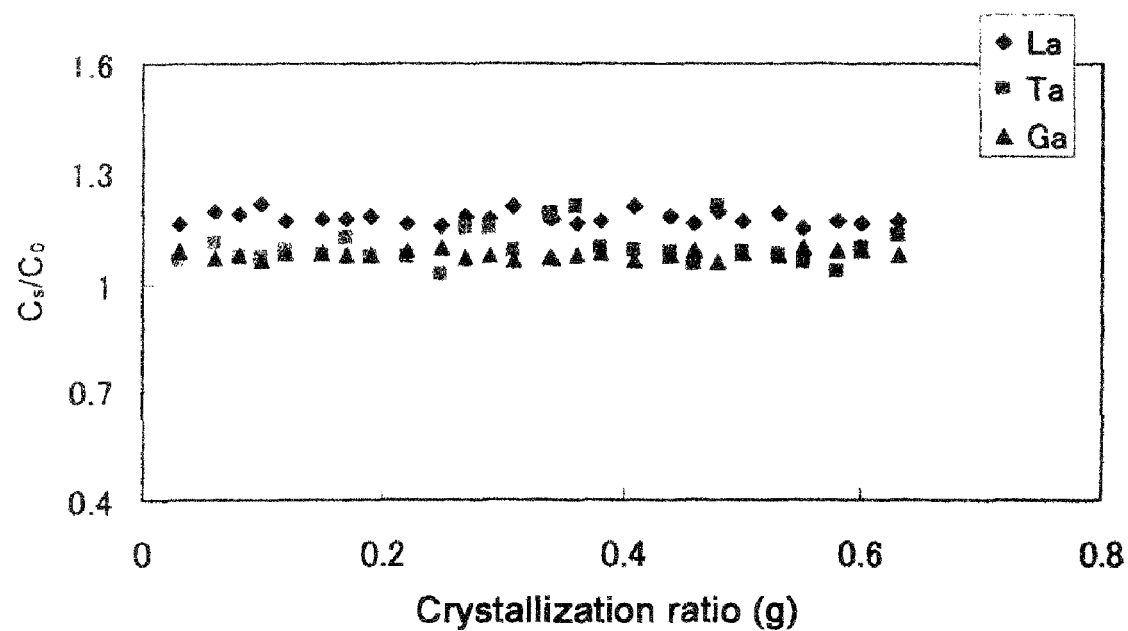
FIG. 11 is a graph showing an atomic distribution of $La_3Ta_{0.5}Ga_{5.5}O_{14}$ single crystal.
Figure 12:
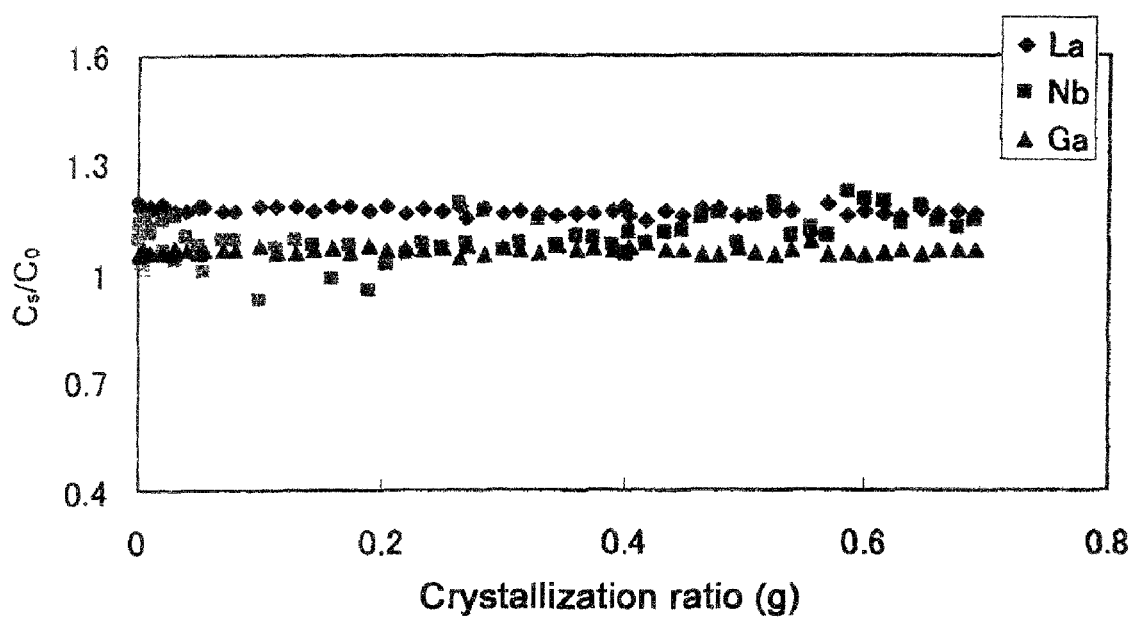
FIG. 12 is a graph showing an atomic distribution of $La_3Nb_{0.5}Ga_{5.5}O_{14}$ single crystal.

Among the above-mentioned Al added rare earth gallate single crystals, in terms of temperature dependence of a mechanical coupling factor, RE (rare earth element) is preferably La, Pr and Nd, and particularly preferably La.

When the Al added rare earth gallate single crystal is $RE_3Ga_{5-x}Al_xSiO_{14}$, in terms of temperature dependence of the mechanical coupling factor, the range of x is preferably $0<x<1.5$, and more preferably $0<x<0.5$. When the Al added rare earth gallate single crystal is $RE_3Ta_{0.5}Ga_{5.5-x}Al_xO_{14}$, the range of x is preferably $0<x<1.65$, and more preferably $0<x<0.5$. When the Al added rare earth gallate single crystal is $RE_3Nb_{0.5}Ga_{5.5-x}Al_xO_{14}$ the range of x is preferably $0<x<1.65$, and more preferably $0<x<0.5$.

In the present invention, a part or all of the site of the rare earth element may be substituted with the alkali earth metal. That is, the present invention includes the Al added rare earth gallate single crystal selected from the group consisting of $RE_{3-x}AE_xGa_{5-x-y}Al_ySiO_{14}$ (wherein RE represents the rare earth and AE represents the alkali earth metal.), $RE_{3-x}AE_xTa_{0.5+x/2}Ga_{5.5-x/2-y}Al_yO_{14}$ (wherein RE represents the rare earth and AE represents the alkali earth metal), and $RE_{3-x}AE_xNb_{0.5+x/2}Ga_{5.5-x/2-y}Al_yO_{14}$ (wherein RE represents the rare earth and AE represents the alkali earth metal).

In terms of temperature dependence of the mechanical coupling factor, AE (alkali earth metal) is preferably Ba, Sr, Ca and Mg, and particularly preferably Ba and Sr.

When the Al added rare earth gallate single crystal is $RE_{3-x}AE_xGa_{5-x-y}Al_ySiO_{14}$ (wherein RE represents the rare earth and AE represents the alkali earth metal.), $0<x\leq3$ and $0<y<1.5$ are preferable, and $0<x<3$ and $0<y<0.5$ are more preferable in terms of temperature dependence of the mechanical coupling factor.

When the Al added rare earth gallate single crystal is $RE_{3-x}AE_xTa_{0.5+x/2}Ga_{5.5-x/2-y}Al_yO_{14}$ (wherein RE represents the rare earth and AE represents the alkali earth metal) or $RE_{3-x}AE_xNb_{0.5+x/2}Ga_{5.5-x/2-y}Al_ySiO_{14}$ (wherein RE represents the rare earth and AE represents the alkali earth metal), $0<x\leq3$ and $0<y<1.65$ are preferable O/020)

The mixed crystal oxide single crystal of the present invention can be produced using any methods publicly known in the prior art, and can be produced, for example, by Czochralski method as follows (Process for Producing $RE_3Ga_{5-x}Al_xSiO_{14}$ Single Crystal)

$RE_2O_3$, $Ca_2O_3$, $SiO_2$ and $Al_2O_3$ are used as starting materials. The $RE_3Ga_{5-x}Al_xSiO_{14}$ single crystal is produced by weighing these starting materials for an objective composition, mixing them using a vibration stirrer, subsequently molding into pellets, which are then baked in an electric furnace (1200 to 1300° C.).

The resulting single crystal is placed in a crucible, and melted by heating using a high frequency work coil to make a melt at a given temperature. The crucible is an iridium metal crucible or an iridium alloy crucible. It is preferable to form a hot zone by providing an outside and an upper side of the crucible with an alumina based or zirconia based heat insulating material. For a crystal growth atmosphere, a mixed gas in which $O_2$ at maximum 2% has been added to Ar is used for the purpose of inhibiting a decomposition reaction of $\beta\text{-}Ca_2O_3$. To control the atmosphere, a chamber made from a silica tube is used.

Subsequently, a seed crystal is secured to a lifting shaft, and a rare earth gallate single crystal ingot is lifted from the melt to grow at a given rotational frequency and lifting speed. At that time, a diameter of the single crystal ingot is automatically controlled using a computer program by change of weight signals detected at a weight sensor leading to the lifting shaft. Crystal growth is terminated at a time point when all of the prepared material is crystallized and the melt is completely consumed. The crystal is gradually cooled to room temperature as is kept in an afterheater.

For the atmosphere when the crystal is produced, as described above, for the purpose of inhibiting the decomposition reaction of β-$Ca_2O_3$, the mixed gas in which 2% $O_2$ at maximum has been added is used. However, by decreasing a mixed ratio of $O_2$ upon cooling after the production, it is possible to produce the material for the piezoelectric device used at the high temperature zone having the resistivity whose temperature dependence is low. A molar fraction (z) of $O_2$ upon cooling is $0 \leqq z \leqq 1\%$, preferably $0 \leqq z \leqq 0.5\%$, and more preferably 0%.

(Process for Producing $RE_3Ta_{0.5}Ga_{5.5-x}Al_xO_{14}$ Single Crystal)

$RE_2O_3$, $Ca_2O_3$, $SiO_2$, $Al_2O_3$ and $Ta_2O_5$ are used as the starting materials. The single crystal is produced by weighing these starting materials for the objective composition, mixing, subsequently molding and baking them. The single crystal is grown in the same way as the above.

(Process for Producing $RE_3Nb_{0.5}Ga_{5.5-x}Al_xO_{14}$ Single Crystal)

$RE_2O_3$, $Ca_2O_3$, $Al_2O_3$ and $Nb_2O_5$ are used as the starting materials. The single crystal is produced by weighing these starting materials for the objective composition/mixing, subsequently molding and baking them. The single crystal is grown in the same way as the above.

The higher the temperature is, the smaller of the resistivity in the rare earth gallate single crystal to which Al has not been added is. Thus, the change of the resistivity generally exceeds 105 at the temperature zone of 100 to 500° C. The change of the resistivity in the Al added rare earth gallate single crystal of the present invention is $10^4$ or less at the temperature zone of 100 to 500° C. Thus, the temperature dependence of the resistivity is low compared with the corresponding rare earth gallate single crystal to which Al has not been added.

The piezoelectric device for high temperature use made by using the aforementioned Al added rare earth gallate single crystal can be used for example as the device for the combustion pressure sensor for automobiles even in an environment at several hundreds ° C.

The piezoelectric sensor for high temperature use obtained by using the piezoelectric device for the high temperature use made by using the aforementioned Al added rare earth gallate single crystal can be used for example as the device for the combustion pressure sensor for automobiles even in the environment at several hundreds ° C.

EXAMPLES

Example 1

$La_3Ga_{4.8}Al_{0.2}SiO_{14}$ Single Crystal

An $La_3Ga_{4.8}Al_{0.2}SiO_{14}$ single crystal was produced by Czochralski method Conditions for producing the $La_3Ga_{4.8}Al_{0.2}SiO_{14}$ single crystal are shown in Table 1.

Example 2

$La_3Ta_{0.5}Ga_{5.3}Al_{0.2}O_{14}$ Single Crystal

An $La_3Ta_{0.5}Ga_{5.3}Al_{0.2}O_{14}$ single crystal was produced by Czochralski method Conditions for producing the $La_3Ta_{0.5}Ga_{5.3}Al_{0.2}O_{14}$ single crystal are shown in Table 1.

Example 3

$La_3Nb_{0.5}Ga_{5.2}Al_{0.2}O_{14}$ Single Crystal

An $La_3Nb_{0.5}Ga_{5.2}Al_{0.2}O_{14}$ single crystal was produced by Czochralski method. Conditions for producing the $La_3Nb_{0.5}Ga_{5.2}Al_{0.2}O_{14}$ single crystal are shown in Table 1.

Comparative Example 1

$La_3Ga_5SiO_{14}$ Single Crystal

An $La_3Ga_5SiO_{14}$ single crystal was produced by Czochralski method. Conditions for producing the $La_3Ga_5SiO_{14}$ single crystal are shown in Table 1.

Comparative Example 2

$La_3Ta_{0.5}Ga_{5.5}O_{14}$ Single Crystal

An $La_3Ta_{0.5}Ga_{5.5}O_{14}$ single crystal was produced by Czochralski method. Conditions for producing the $La_3Ta_{0.5}Ga_{5.5}O_{14}$ single crystal are shown in Table 1

Comparative Example 3

$La_3Nb_{0.5}Ga_{5.5}O_{14}$ Single Crystal

An $La_3Nb_{0.5}Ga_{5.5}O_{14}$ single crystal was produced by Czochralski method. Conditions for producing the $La_3Nb_{0.5}Ga_{5.5}O_{14}$ single crystal are shown in Table 1.

TABLE 1

| | Compound composition | Starting material | Melting point Atmosphere-P* Atmosphere-C** Crucible material | $d_{12}$ [100 to 600° C.] (pC/N) | Resistivity change [100 to 600° C.] (Ω) |
|---|---|---|---|---|---|
| Example 1 | $La_3Ga_{4.8}Al_{0.2}SiO_{14}$ | $La_2O_3$(4N) $Ga_2O_3$(4N) $SiO_2$(4N) $Al_2O_3$(4N) | 1380° C. Ar(98%) + $O_2$(2%) Ar(100%) Ir crucible | 6.545 No change | $6.79 \times 10^{12}$ to $8.11 \times 10^8$ |
| Example 2 | $La_3Ta_{0.5}Ga_{5.3}Al_{0.2}O_{14}$ | $La_2O_3$(4N) $Ga_2O_3$(4N) $Al_2O_3$(4N) $Ta_2O_5$(4N) | 1700° C. Ar(98%) + $O_2$(2%) Ar(100%) Ir crucible | 6.719 No change | $2.30 \times 10^{12}$ to $6.01 \times 10^8$ |
| Example 3 | $La_3Nb_{0.5}Ga_{5.2}Al_{0.2}O_{14}$ | $La_2O_3$(4N) $Ga_2O_3$(4N) | 1700° C. Ar(98%) + $O_2$(2%) | 6.787 No | $4.70 \times 10^{12}$ to |

TABLE 1-continued

|  | Compound composition | Starting material | Melting point Atmosphere-P* Atmosphere-C** Crucible material | $d_{12}$ [100 to 600° C.] (pC/N) | Resistivity change [100 to 600° C.] (Ω) |
|---|---|---|---|---|---|
| Comparative Example 1 | $La_3Ga_5SiO_{14}$ | $Al_2O_3(4N)$ $Nb_2O_5(4N)$ $La_2O_3(4N)$ $Ga_2O_3(4N)$ $SiO_2(4N)$ | Ar(100%) Ir crucible 1380° C. Ar(98%) + $O_2$(2%) Ar(98%) + $O_2$(2%) Ir crucible | change 6.558 No change | $4.5 \times 10^8$ $6.4 \times 10^{12}$ to $8.7 \times 10^5$ |
| Comparative Example 2 | $La_3Ta_{0.5}Ga_{5.5}O_{14}$ | $La_2O_3(4N)$ $Ga_2O_3(4N)$ $Ta_2O_5(4N)$ | 1700° C. Ar(98%) + $O_2$(2%) Ar(98%) + $O_2$(2%) Ir crucible | 6.715 No change | $5.0 \times 10^{12}$ to $6.7 \times 10^6$ |
| Comparative Example 3 | $La_3Nb_{0.5}Ga_{5.5}O_{14}$ | $La_2O_3(4N)$ $Ga_2O_3(4N)$ $Nb_2O_5(4N)$ | 1700° C. Ar(98%) + $O_2$(2%) Ar(98%) + $O_2$(2%) Ir crucible | 6.873 No change | $9.5 \times 10^{11}$ to $3.0 \times 10^6$ |

*Atmosphere in production
**Atmosphere in cooling

Figure 13:
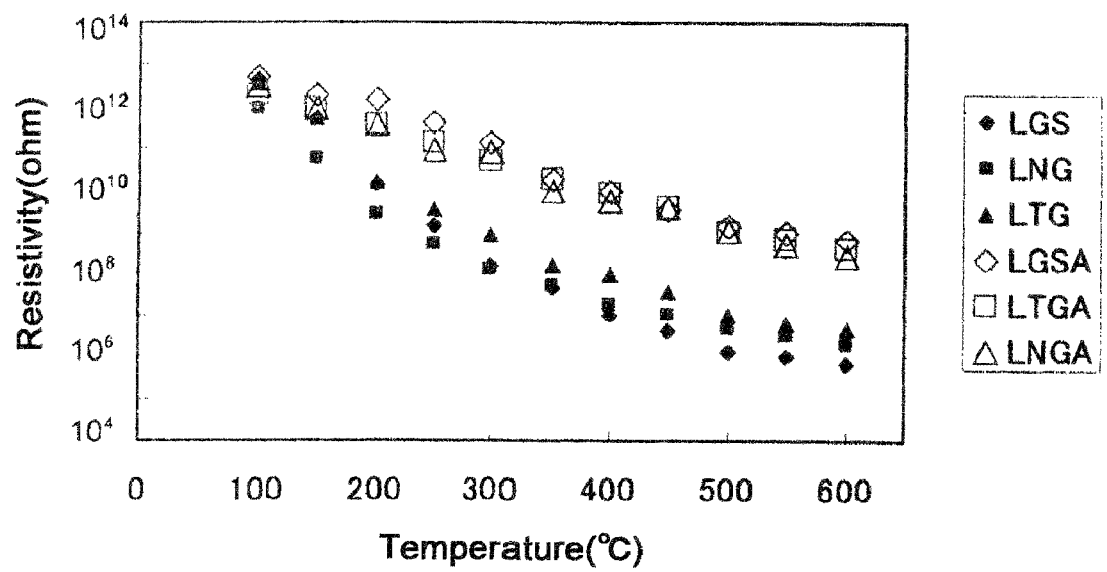
FIG. 13 is a graph showing temperature dependence of a resistivity.
Figure 14:
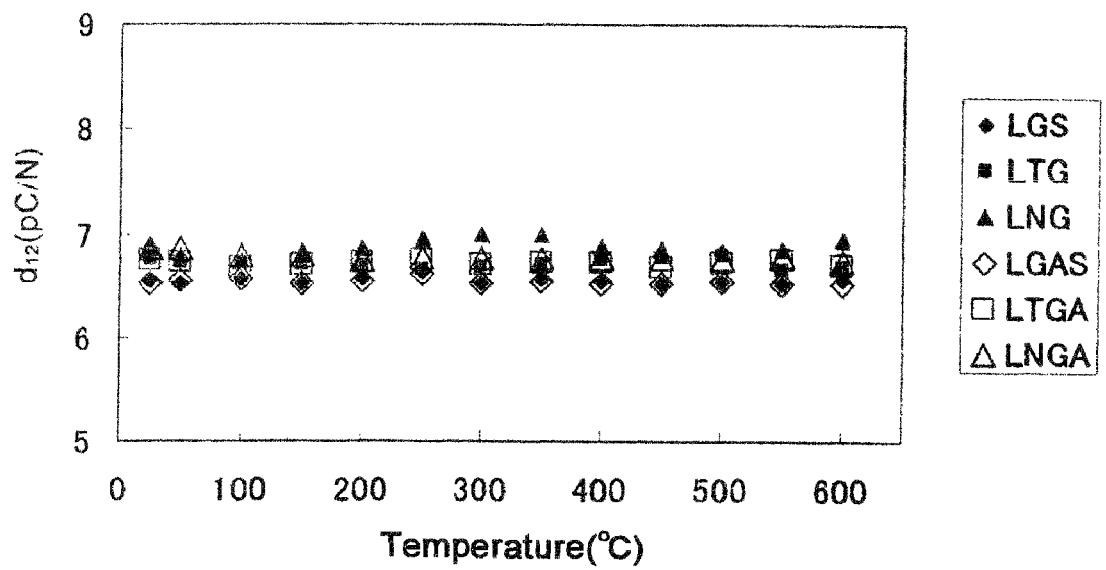
FIG. 14 is a graph showing the temperature dependence of $d_{12}$.

Photographs of the single crystals in Examples 1 to 3 and Comparative Examples 1 to 3 are shown in FIGS. 1 to 6. Each atomic distribution in the single crystals in Examples 1 to 3 and Comparative Examples 1 to 3 are shown in FIGS. 7 to 12. The temperature dependence of the resistivity in the single crystals in Examples 1 to 3 and Comparative Examples 1 to 3 are shown in FIG. 13. The temperature dependence of $d_{12}$ in the single crystals in Examples 1 to 3 and Comparative Examples 1 to 3 are shown in FIG. 14.

Example 5

Effect of Molar Fraction of Oxidative Gas

In this Example, the molar fraction of the oxidative gas ($O_2$ in this Example) in the atmosphere upon cooling after producing the single crystal was changed in the range of 0 to 2%.

The production conditions other than the molar fraction are the same as in Example 1. That is, the molar fraction of $O_2$ upon growing is 2%.

The changes of the resistivity at the temperature zone of 100° C. to 600° C. are shown in Table 2.

TABLE 2

| Sample No. | $O_2$ Molar fraction (z) | Resistivity change [100 to 600° C.] (Ω) |
|---|---|---|
| 1 | 0% | $6.79 \times 10^{12}$ to $8.11 \times 10^8$ |
| 2 | 0.1% | $6.81 \times 10^{12}$ to $8.02 \times 10^8$ |
| 3 | 0.2% | $6.77 \times 10^{12}$ to $7.85 \times 10^8$ |
| 4 | 0.5% | $6.78 \times 10^{12}$ to $7.72 \times 10^8$ |
| 5 | 0.8% | $6.65 \times 10^{12}$ to $7.52 \times 10^8$ |
| 6 | 1.0% | $6.22 \times 10^{12}$ to $7.01 \times 10^8$ |
| 7 | 1.5% | $6.19 \times 10^{12}$ to $6.70 \times 10^7$ |
| 8 | 2.0% | $6.15 \times 10^{12}$ to $6.55 \times 10^7$ |

As shown in Table 2, compared with the case (No. 8) where the $O_2$ molar fraction was not changed upon growing and upon cooling, in the case where the $O_2$ molar fraction was decreased upon cooling, it is found that a resistivity change ratio was reduced. Particularly, it is found that the resistivity change is drastically reduced when the $O_2$ molar fraction is lowered to 1% or less.

Example 6

Effect of Composition Ratio of Al

In this Example, the temperature dependence of the mechanical coupling factor was examined by changing the composition ratio (x) of Al in $La_3Ga_{5-x}Al_xSiO_{14}$.

The conditions other than x were the same as in Example 1.

The temperature dependence of the mechanical coupling factor was measured by a resonance antiresonance method using an impedance gain phase analyzer.

TABLE 3

| Sample No. | Al composition ratio (%) | Mechanical coupling factor [100 to 600° C.](pC/N) |
|---|---|---|
| 9 | 0.1 | 6.545 (no temperature change) |
| 10 | 0.2 | 6.546 (no temperature change) |
| 11 | 0.3 | 6.551 (no temperature change) |
| 12 | 0.4 | 6.542 (no temperature change) |
| 13 | 0.5 | 6.548 (no temperature change) |
| 14 | 0.6 | 6.552 (no temperature change) |
| 15 | 0.9 | 6.560 (no temperature change) |
| 16 | 1.1 | 6.559 (no temperature change) |
| 17 | 1.5 | 6.547 (no temperature change) |
| 18 | 1.9 | 6.554 (no temperature change) |
| 19 | 2.1 | 6.545 (no temperature change) |
| 20 | 2.5 | 6.556 (no temperature change) |

Example 7

Substitution with Alkali Earth Metal

In this Example, a part of La was substituted with Ba in Example 1.

Other points were the same as in Example 1.

When substituted with Ba, the similar effect to that in Example 1 was accomplished.

Examples 8 to 11

Effects of Treatment with Heat

In this Example, the condition for the treatment with heat after making the single crystal was changed.

TABLE 4

| | Compound Composition | Thermal treatment atmosphere | Thermal treatment temperature (°C.) | Thermal treatment time (hr) | Resistivity change before thermal treatment [100-600° C.] (Ω) | Resistivity change after thermal treatment [100-600° C.] (Ω) |
|---|---|---|---|---|---|---|
| Example 8 | $La_3Ga_5SiO_{14}$ | Ar | 600 | 10 | $3.26 \times 10^{13}$ to $3.56 \times 10^4$ | $4.56 \times 10^{15}$ to $6.71 \times 10^9$ |
| Example 9 | $La_3Ga_{4.8}Al_{0.2}SiO_{14}$ | $N_2$ | 1000 | 24 | $7.21 \times 10^{13}$ to $4.41 \times 10^4$ | $5.96 \times 10^{15}$ to $3.71 \times 10^9$ |
| Example 10 | $La_3Ta_{0.5}Ga_{5.3}Al_{0.2}O_{14}$ | $N_2$ | 1200 | 5 | $3.59 \times 10^{13}$ to $5.82 \times 10^4$ | $6.26 \times 10^{15}$ to $6.92 \times 10^9$ |
| Example 11 | $La_3Ga_5SiO_{14}$ | $N_2$ | 1200 | 5 | $5.56 \times 10^{13}$ to $1.22 \times 10^4$ | $3.57 \times 10^{15}$ to $4.81 \times 10^9$ |
| Comparative Example 4 | $La_3Ga_{4.8}Al_{0.2}SiO_{14}$ | Air | 600 | 12 | $5.55 \times 10^{12}$ to $3.29 \times 10^5$ | $3.21 \times 10^{12}$ to $8.89 \times 10^5$ |
| Comparative Example 5 | $La_3Ta_{0.5}Ga_{5.3}Al_{0.2}O_{14}$ | $N_2$ + 5% $O_2$ | 1000 | 10 | $6.45 \times 10^{13}$ to $5.53 \times 10^4$ | $5.26 \times 10^{12}$ to $1.83 \times 10^4$ |
| Comparative Example 6 | $La_3Ga_5SiO_{14}$ | Ar | 300 | 24 | $7.82 \times 10^{12}$ to $4.11 \times 10^4$ | $7.26 \times 10^{12}$ to $3.57 \times 10^4$ |
| Comparative Example 7 | $La_3Ga_{4.8}Al_{0.2}SiO_{14}$ | Ar | 1500 | 5 | $3.34 \times 10^{12}$ to $4.87 \times 10^4$ | $2.16 \times 10^{12}$ to $5.67 \times 10^4$ |
| Comparative Example 8 | $La_3Ta_{0.5}Ga_{5.3}Al_{0.2}O_{14}$ | $N_2$ | 1200 | 1 | $6.96 \times 10^{12}$ to $3.94 \times 10^4$ | $7.36 \times 10^{12}$ to $2.78 \times 10^4$ |

As shown in Table 4, it has been found that the resistivity change was reduced under the condition for the treatment with heat according to the eighth embodiment mentioned above in the Means for Solving Problem, but under the conditions other than the above, the resistivity change was increased. Furthermore, in the gallate oxide single crystal treated with heat under the condition for the treatment with heat according to the eighth embodiment, an absolute value of the resistivity was increased by 2 to 4 digits.

INDUSTRIAL APPLICABILITY

According to the present invention, it becomes possible to provide the gallate single crystal which can be used at the high temperature zone particularly exceeding 400° C. and further has the resistivity whose temperature dependence is low, and the process for production thereof, as well as the piezoelectric device and the piezoelectrilc sensor for high temperature uses.

The invention claimed is:

1. A gallate single crystal characterized by having a composition selected from the group consisting of $RE_3Ga_{5-x}Al_xSiO_{14}$ (wherein RE represents a rare earth, and $0<x<5$), $RE_3Ta_{0.5}Ga_{5.5-x}Al_xO_{14}$ (wherein RE represents a rare earth, and $0<x<5.5$) and $RE_3Nb_{0.5}Ga_{5.5-x}Al_xO_{14}$ (wherein RE represents a rare earth, and $0<x<5.5$), and characterized in that a resistivity change is $10^4$ or less at a temperature zone of 100° C. to 600° C.

2. The single crystal according to claim 1 characterized by being $0<x<1.5$ in $RE_3Ga_{5-x}Al_xSiO_{14}$, $0<x<1.65$ in $RE_3Ta_{0.5}Ga_{5.5-x}Al_xO_{14}$, and $0<x<1.65$ in $RE_3Nb_{0.5}Ga_{5.5-x}Al_xO_{14}$.

3. A piezoelectric device characterized by being composed of the single crystal according to claim 1.

4. A piezoelectric sensor for high temperature use characterized by using the piezoelectric device according to claim 3.

5. The piezoelectric sensor for high temperature use according to claim 4 characterized by being used at a temperature zone of 100 to 600° C.

\* \* \* \* \*